US012622256B2

(12) United States Patent
Chen et al.

(10) Patent No.: US 12,622,256 B2
(45) Date of Patent: May 5, 2026

(54) CONDUCTIVE VIA STRUCTURES FOR FAR-END CROSSTALK CANCELLATION

(71) Applicant: T-HEAD (SHANGHAI) SEMICONDUCTOR CO., LTD., Shanghai (CN)

(72) Inventors: Yanbin Chen, Shanghai (CN); Tengfei Wang, Shanghai (CN); Tingting Pang, Shanghai (CN); Shuai Wang, Shanghai (CN); Huili Fu, Shanghai (CN); Wenkai Fan, Shanghai (CN); Xu Yan, Shanghai (CN); Huan Liu, Shanghai (CN); Jianwei Guo, Shanghai (CN)

(73) Assignee: T-HEAD (SHANGHAI) SEMICONDUCTOR CO., LTD., Shanghai Free Trade Area (CN)

(*) Notice: Subject to any disclaimer, the term of this patent is extended or adjusted under 35 U.S.C. 154(b) by 773 days.

(21) Appl. No.: 17/819,422

(22) Filed: Aug. 12, 2022

(65) Prior Publication Data

US 2023/0290723 A1 Sep. 14, 2023

(30) Foreign Application Priority Data

Mar. 11, 2022 (CN) .......................... 202210245727.0

(51) Int. Cl.
| | |
|---|---|
| *H01L 23/522* | (2006.01) |
| *H01L 23/48* | (2006.01) |
| *H01L 23/485* | (2006.01) |
| *H01L 23/58* | (2006.01) |
| *H01L 23/66* | (2006.01) |
| *H10W 20/20* | (2026.01) |

(52) U.S. Cl.
CPC ........... *H10W 20/42* (2026.01); *H10W 20/20* (2026.01); *H10W 20/40* (2026.01);
(Continued)

(58) Field of Classification Search
CPC . H01L 23/5226; H01L 23/481; H01L 23/485; H01L 23/5222; H01L 23/585; H01L 23/66; H01L 23/642
See application file for complete search history.

(56) References Cited

U.S. PATENT DOCUMENTS 7,154,047 B2 * 12/2006 Howard .................. H01L 23/66
174/262
9,722,012 B1 8/2017 Pathmanathan et al.
(Continued)

FOREIGN PATENT DOCUMENTS

| CN | 104051425 A | 9/2014 |
|---|---|---|
| CN | 104519656 A | 4/2015 |

OTHER PUBLICATIONS

R. K. Kunze et al., "Crosstalk mitigation and impedance management using tabbed lines", Intel White Paper, 2015, Intel.com.
(Continued)

*Primary Examiner* — Jeff W Natalini
*Assistant Examiner* — Rose Keagy
(74) *Attorney, Agent, or Firm* — WPAT, P.C.; Anthony King

(57) ABSTRACT

A semiconductor structure including: a substrate including a plurality of conductive layers and a plurality of insulating layers stacked alternately with each other along a vertical direction of the substrate; a first conductive via structure extending from a top conductive layer of the conductive layers to a bottom conductive layer of the conductive layers and including a first capacitive structure, the first capacitive structure extending in a first conductive layer of the conductive layers; a second conductive via structure extending from the top conductive layer to the bottom conductive layer and including a second capacitive structure extending in the first conductive layer; and a third capacitive structure extending in the first conductive layer or a second conduc-
(Continued)

tive layer of the conductive layers, wherein the third capacitive structure forms a first mutual capacitance with the first capacitive structure and a second mutual capacitance with the second capacitive structure.

20 Claims, 10 Drawing Sheets

(51) Int. Cl.

| | |
|---|---|
| *H10W 20/40* | (2026.01) |
| *H10W 20/42* | (2026.01) |
| *H10W 42/00* | (2026.01) |
| *H10W 44/20* | (2026.01) |

(52) U.S. Cl.
CPC ......... *H10W 20/495* (2026.01); *H10W 42/00* (2026.01); *H10W 44/20* (2026.01); *H10W 44/209* (2026.01)

(56) References Cited

U.S. PATENT DOCUMENTS

| | | | |
|---|---|---|---|
| 10,103,054 | B2 | 10/2018 | Zhang et al. |
| 10,373,901 | B1 | 8/2019 | Tsao et al. |
| 2008/0073796 | A1* | 3/2008 | Harvey ............. H01L 23/49827 |
| | | | 257/774 |
| 2014/0268614 | A1* | 9/2014 | Zhang ................... H01L 21/768 |
| | | | 174/262 |
| 2020/0098677 | A1* | 3/2020 | Tsao ................. H01L 23/49838 |
| 2021/0376448 | A1* | 12/2021 | Drew ....................... H04B 5/22 |

OTHER PUBLICATIONS

Office action dated Dec. 16, 2025 from the China corresponding application.

\* cited by examiner

CONDUCTIVE VIA STRUCTURES FOR FAR-END CROSSTALK CANCELLATION

PRIORITY CLAIM AND CROSS-REFERENCE

This application claims priority to Chinese Pat. Application No. 202210245727.0 filed Mar. 11, 2022, the disclosures of which are hereby incorporated by reference in its entirety.

TECHNICAL FIELD

The present disclosure relates to a semiconductor structure, and more particularly to a conductive via structure for improving crosstalk in the semiconductor structure.

BACKGROUND

The transmission performance required by the advanced signaling system includes faster transmission speed and smaller chip size to achieve better user experience. However, in a high-speed signal transmission system, due to increased routing density and increased signal transmission frequency, the crosstalk induced between adjacent signal transmission paths continues to be a challenging task. For example, far-end crosstalk (FEXT) between transmission paths has become a major problem to be solved to mitigate the crosstalk effect. Accordingly, efforts have been developed in the field in enhancing the transmission architectures and methods for reducing or eliminating the FEXT.

SUMMARY

According to an embodiment of the present disclosure, a semiconductor structure includes: a substrate, including a plurality of conductive layers and a plurality of insulating layers stacked alternately with each other along a vertical direction of the substrate; a first conductive via structure extending from a top conductive layer of the plurality of conductive layers to a bottom conductive layer of the plurality of conductive layers and including a first capacitive structure, the first capacitive structure extending in a first conductive layer of the plurality of conductive layers; a second conductive via structure extending from the top conductive layer to the bottom conductive layer and including a second capacitive structure extending in the first conductive layer; and a third capacitive structure extending in the first conductive layer or a second conductive layer of the plurality of conductive layers, wherein the third capacitive structure forms a first mutual capacitance with the first capacitive structure and a second mutual capacitance with the second capacitive structure.

In an embodiment, the first capacitive structure and the second capacitive structure do not overlap in projection in the vertical direction.

In an embodiment, the third capacitive structure is overlapped in projection with the first capacitive structure and the second capacitive structure in the vertical direction.

In an embodiment, the first conductive layer is arranged in the bottom conductive layer.

In an embodiment, the first conductive layer is arranged in the top conductive layer or another conductive layer between the top conductive layer and the bottom conductive layer.

In an embodiment, the third capacitive structure includes a first conductive pad arranged in a conductive layer same as the first capacitive structure and the second capacitive structure.

In an embodiment, the first capacitive structure includes a second conductive pad, the first conductive via structure further includes a third conductive pad arranged in a third conductive layer of the plurality of conductive layers, wherein an area of the second conductive pad is greater than an area of the third conductive pad.

In an embodiment, the first conductive via structure further includes a fourth conductive pad arranged in the third conductive layer, wherein the third conductive pad and the fourth conductive pad are connected through a connecting portion, and wherein the third capacitive structure and the fourth conductive pad form a third mutual capacitance.

In an embodiment, the second conductive via structure further includes a fifth conductive pad arranged in the third conductive layer, wherein the third capacitive structure forms a fourth mutual capacitance with the fifth conductive pad.

In an embodiment, the fourth conductive pad and the fifth conductive pad do not overlap in projection in the vertical direction.

In an embodiment, the third capacitive structure and the first capacitive structure or the second capacitive structure do not overlap in projection in the vertical direction.

In an embodiment, the semiconductor structure further includes a third conductive via structure, separate from the first conductive via structure and the second conductive via structure, and extending to a fourth conductive layer of the plurality of conductive layers from the second conductive layer, wherein the third capacitive structure is included in the third conductive via structure.

In an embodiment, the semiconductor structure further includes a fourth capacitive structure, wherein the third capacitive structure and the fourth capacitive structure are arranged in different layers of the plurality of conductive layers, wherein the fourth capacitive structure forms a fifth mutual capacitance with the first conductive via structure and forms a sixth mutual capacitance with the second conductive via structure.

In an embodiment, the third capacitive structure is electrically insulated from the fourth capacitive structure.

In an embodiment, the third capacitive structure and the fourth capacitive structure overlap in projection, partially overlap in projection, or do no overlap in projection in the vertical direction.

In an embodiment, the first via structure includes a sixth conductive pad, wherein the fourth capacitive structure and the sixth conductive pad are arranged in a same conductive layer of the plurality of conductive layers, wherein the fourth capacitive structure and the sixth conductive pad form a seventh mutual capacitance.

According to an embodiment of the present disclosure, an electronic device includes: the semiconductor structure according to one of claims 1-16; a printed circuit board arranged on a first side of the semiconductor structure and adjacent to the bottom conductive layer of the semiconductor structure; a connector between the printed circuit board and the semiconductor structure; and a chip on a second side of the semiconductor structure opposite the first side and adjacent to the top conductive layer of the semiconductor structure, wherein the printed circuit board is electrically connected to the chip through the connector and the first conductive via structure and the second conductive via structure of the semiconductor structure.

According to an embodiment of the present disclosure, a method of crosstalk cancellation includes: transmitting an electrical signal in a first conductive via structure and a second conductive via structure of a semiconductor structure, the first conductive via structure including a first capacitive structure and a second capacitive structure, wherein the semiconductor structure further includes a third capacitive structure separate from the first conductive via structure and the second conductive via structure; and, during the transmitting of the electrical signal in the first conductive via structure and the second conductive via structure, storing energy in an electric field through a first mutual capacitance between the first capacitive structure and the third capacitive structure and a second mutual capacitance between the second capacitive structure and the third capacitive structure.

In an embodiment, the first capacitive structure and the second capacitive structure extend in a vertical direction, wherein the first capacitive structure and the second capacitive structure do not overlap in projection in the vertical direction, wherein the third capacitive structure includes a first portion overlapped in projection with and the first capacitive structure in the vertical direction, and wherein the third capacitive structure includes a second portion overlapped in projection with the second capacitive structure in the vertical direction.

In an embodiment, the first capacitive structure of the first conductive via structure or the second capacitive structure of the second conductive via structure includes a conductive pad in a top conductive layer or a bottom conductive layer of a plurality of conductive layers of the semiconductor structure.

With the above-mentioned arrangements of the present invention for the capacitive structure and the method for crosstalk cancellation, a mutual capacitance can be generated between adjacent paths of the semiconductor structure without causing excessive insertion loss. Therefore, the performance of the transmission paths can be effectively improved, and high-density and high-speed performance of the signaling transmission can be achieved.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
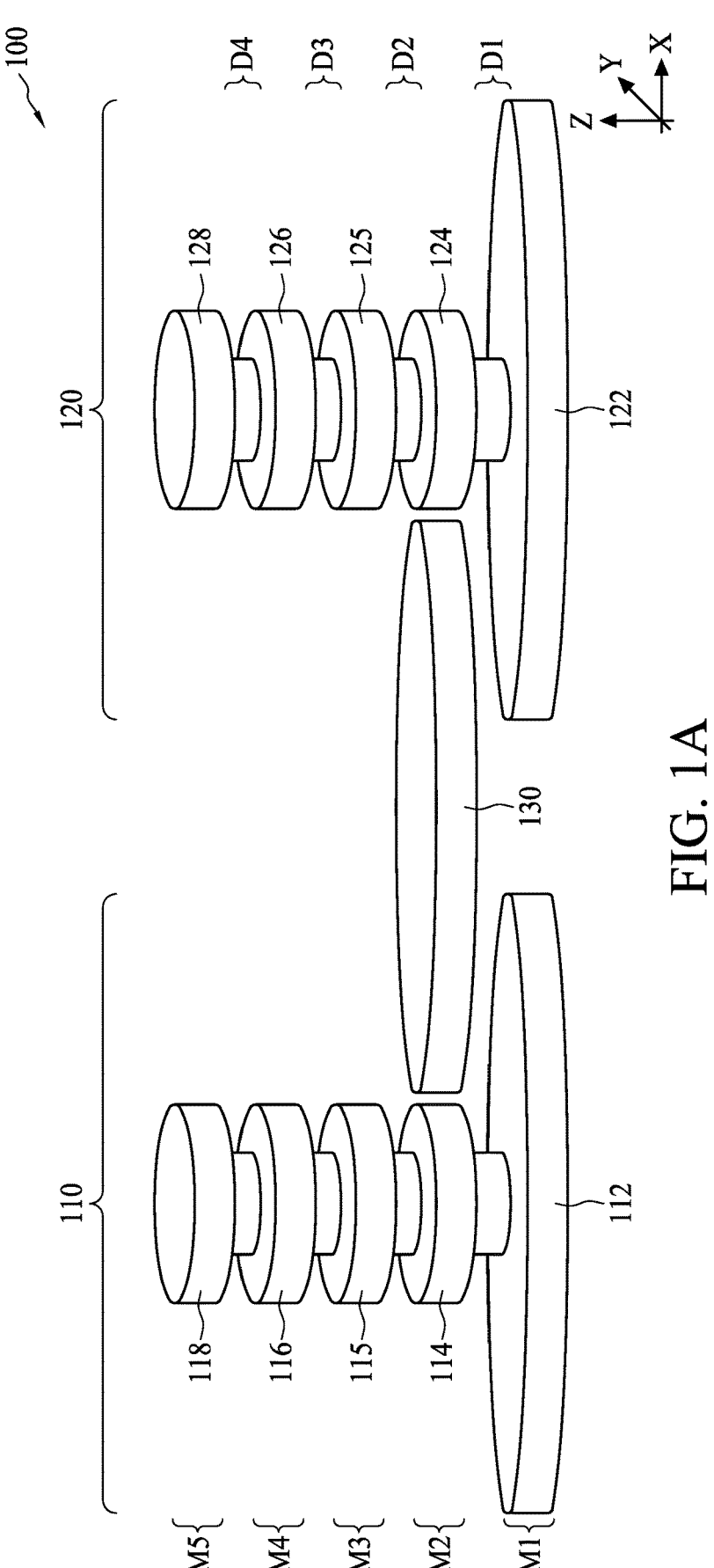
FIGS. 1A and 1B are perspective and cross-sectional views, respectively, of a routing path of an example semiconductor structure, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first", "second" and "third" describe various parts, components, regions, layers and/or sections, but the parts, components, regions, layers and/or or sections should not be limited by such terms. Such terms may only be used to distinguish the parts, components, regions, layers or sections from one another. Terms such as "first," "second," and "third," used herein do not imply a sequence or order unless clearly indicated otherwise.

The singular forms "a", "an" and "the" may also include the plural forms unless the context clearly dictates otherwise. The term "connected", along with its derivatives, may be used herein to describe the structural relationship between components. "Connected" may be used to describe two or more elements in direct physical or electrical contact with each other. "Connected" may also be used to indicate that two or more elements are in direct or indirect physical or electrical contact with each other (with intervening elements therebetween), and/or that the two or more elements cooperate or interact with each other.

The present invention relates to a conductive via structure for electronic devices or packaging structures, in which the conductive via structure can be used in or between different types of devices, such as a substrate, a chip, a system-on-chip (SOC), a connector, a circuit board, and can connect the input/output (I/O) channels of the chip, substrate, connector or circuit board to transmit data and/or clock signals to form a high-speed signaling system. In some embodiments, the conductive via structure may also serve as a signaling channel within the various devices described above, such as a chip, a substrate, a system-on-a-chip (SOC), a connector, or a circuit board. By using the capacitive structure of the present invention as a crosstalk canceller, the influence of far-end crosstalk (FEXT) can be effectively reduced or eliminated, thereby realizing a signaling system with high speed and low noise interference.

In an exemplary embodiment, a structure of a pair of adjacent single-ended conductive vias can be used to describe the effect of FEXT. The FEXT for a single-ended conductive via structure can be expressed as follows:

$$V_{FEXT} = \frac{t_{pd}}{2}\left(\frac{C_m}{C_s} - \frac{L_m}{L_s}\right)\frac{\partial V_{agg}}{\partial t} \tag{1}$$

5

In Equation 1, $V_{FEXT}$ denotes the magnitude of the far-end crosstalk, Cm denotes the mutual capacitance between the two conductive via structures, Lm denotes the mutual inductance between the two conductive via structures, and Cs and Ls denote the self-capacitance and self-inductance thereof. The term $V_{agg}$ denotes the voltage of the aggressor signal and time $t_{pd}$ denotes the propagation delay of the signal.

As far as crosstalk in a vertical conductive via structure of a substrates (e.g., a package substrate, a socket, or a printed circuit board) as concerned, inductance typically dominates the overall crosstalk amount, such that $V_{FEXT}$ is less than zero. Therefore, in the time domain, the FEXT of the vertical conductive via structure often has a negative polarity (i.e., the rising edge excitation source is negative in polarity). In addition, in most cases, the mutual inductance Lm, the self-capacitance Cs and the self-inductance Ls are not easy to control in the closely spaced vertical conductive via structure. Therefore, in order to reduce or eliminate a negative FEXT, the influence of the inductance on FEXT should be reduced by increasing the mutual capacitance Cm.

Figure 1B:
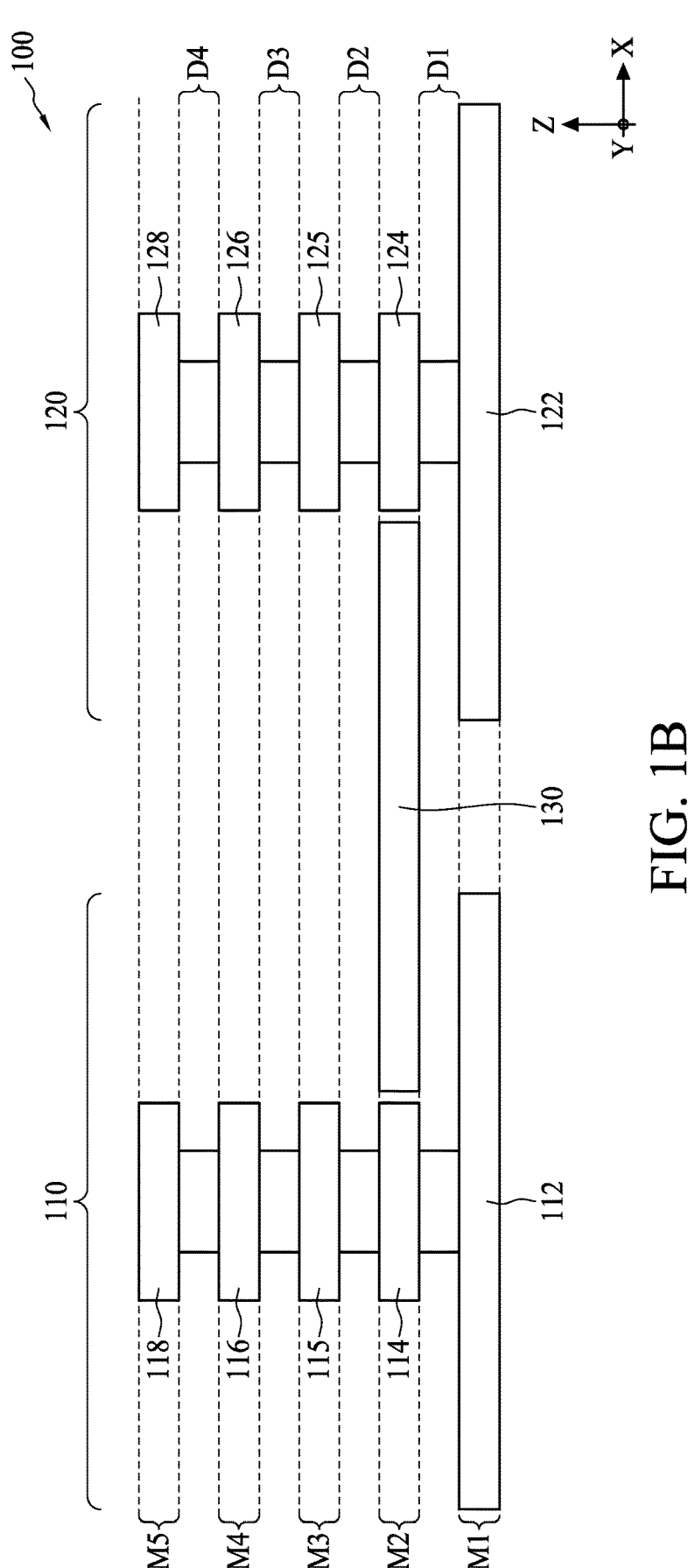

FIGS. 1A and 1B are perspective and cross-sectional views of a routing path of an example semiconductor structure 100, according to an embodiment of the present disclosure. In an embodiment, the semiconductor structure 100 is a substrate, a semiconductor package, a circuit board (e.g., a printed circuit board or PCB), a chip, a die, a socket, an interposer, and other similar semiconductor structures. As shown in FIGS. 1A and 1B, the semiconductor structure 100 includes two example conductive via structures 110 and 120 that extend in a vertical (Z) direction, where the vertical direction can be defined as a direction perpendicular to the active surface of each component layer or structure in the substrate (e.g., a circuit board, a chip, a die, or an interposer), or the Z direction of the coordinate system. The conductive via structures 110 and 120 extend through all or a portion of the thickness of the semiconductor structure 100 in the vertical direction, and respectively representing at least a portion of the routing of the two transmission paths in the semiconductor structure 100. FIGS. 1A and 1B illustrate only two conductive via structures 110 and 120, but in other embodiments, the semiconductor structure 100 may include other numbers of conductive via structures to implement the routing of other transmission paths of the semiconductor structure 100.

As shown in FIGS. 1A and 1B, the conductive via structure 110 has a substrate in which a plurality of vertical segments are arranged, and conductive pads are arranged between each vertical segment to connect each vertical segment in a vertical direction. The conductive pads may be via pads. The conductive via structure 110 includes conductive pads 112, 114, 115, 116 and 118. In an embodiment, the conductive pad 112 has a surface extending along the horizontal (XY) direction. The surface of the conductive pad 112 is substantially perpendicular to the direction in which the conductive via structure 110 extends. Likewise, conductive pads 114, 115, 116 and 118 each have a surface extending along the XY plane. The respective surfaces of the conductive pads 114, 115, 116 and 118 are substantially perpendicular to the direction in which the conductive via structure 110 extends. The conductive pads 112, 114, 115, 116 and 118 extend outward from the vertical segments of the conductive via structure 110 from a top-view perspective.

Likewise, the conductive via structure 120 includes conductive pads 122, 124, 125, 126 and 128. In an embodiment, the conductive pad 122 has a surface extending in the horizontal direction. The surface of the conductive pad 122 is substantially perpendicular to the direction in which the conductive via structure 120 extends. The conductive pads 124, 125, 126 and 128 each have a surface extending in the horizontal direction. The respective surfaces of the conductive pads 124, 125, 126 and 128 are substantially perpendicular to the direction in which the conductive via structure 120 extends. The conductive pads 122, 124, 125, 126 and 128 extend outward from the vertical segments of the conductive via structure 120 from a top-view perspective.

In an embodiment, the substrate of the semiconductor structure 100 has a plurality of insulating layers D1, D2, D3 and D4 extending in the horizontal direction and stacked in the vertical direction. The insulating layers D1-D4 may be made of insulating materials, such as polypropylene (PP), silicon oxide (SiO$_2$), nitrogen oxide (SiN), or other insulating or dielectric materials, and thus may also be referred to as dielectric layers. The insulating material in the insulating layers D1-D4 insulates the conductive via structure 110 from the conductive via structure 120 or other conductive materials to avoid short circuits or leakage. In an embodiment, the insulating layers D1-D4 of the semiconductor structure 100 are stacked over each other. In other embodiments, the semiconductor structure 100 further includes a plurality of conductive layers M1, M2, M3, M4 and M5 extending in the horizontal direction and stacked in the vertical direction. The conductive layers M1-M5 can be made of conductive materials, such as copper, aluminum, gold, silver, tungsten, titanium and other conductive metals or alloys of the above materials. The conductive layers M1-M5 and the aforementioned insulating layers D1-D4 can be arranged alternately, so that the conductive via structures 110 and 120 are arranged therein.

In an embodiment, the conductive pads 112, 114, 115, 116 and 118 of the conductive via structure 110 and the conductive pads 122, 124, 125, 126 and 128 of the conductive via structure 120 are disposed in the respective insulating layers of the semiconductor structure 100. In an embodiment, the conductive pads 112, 114, 115, 116 and 118 and the conductive pads 122, 124, 125, 126 and 128 are provided in respective conductive layers of the semiconductor structure 100. In an embodiment, the conductive pads 112 and 122 are arranged in the same insulating layer or conductive layer of the semiconductor structure 100, the conductive pads 114 and 124 are arranged in the same insulating layer or conductive layer of the semiconductor structure 100, and the conductive pads 115 and 125 are arranged in the same insulating layer or conductive layer of the semiconductor structure 100. The conductive pads 116 and 126 are arranged in the same insulating layer or conductive layer of the semiconductor structure 100, and the conductive pads 118 and 128 are arranged in the same insulating layer or conductive layer of the semiconductor structure 100. In an embodiment, the vertical segments of the conductive via structures 110 or 120 are disposed in the insulating layers D1-D4. In an embodiment, the conductive pads 112, 114, 115, 116 and 118 of the conductive via structure 110 or the conductive pads 122, 124, 125, 126 and 128 of the conductive via structure 110 are disposed in the conductive layers M1-M5.

In an embodiment, the conductive pads 112, 122 are arranged at a bottom conductive layer M1 or a top conductive layer M5 of the substrate of the semiconductor structure 100. In an embodiment, the conductive pads 118, 128 are located in the top conductive layer M5 or the bottom conductive layer M1 of the substrate of the semiconductor structure 100. In an embodiment, the conductive pads 112, 122, 118 or 128 are located in a conductive layer between the bottom conductive layer M1 and the top conductive layer M5 of the substrate of the semiconductor structure 100. In an embodiment, the area of the conductive pad 112 is the greatest among all the conductive pads of the conductive via structure 110, or is greater than the areas of other conductive pads of the conductive via structure 110, and the area of the conductive pad 122 is the greatest among all the conductive pads of the structure 120, or is greater than the areas of other conductive pads of the conductive via structure 120. In an embodiment, the conductive pads 114, 115, 116 and 118 of the conductive via structure 110 have substantially equal areas, and the conductive pads 124, 125, 126 and 128 of the conductive via structure 120 have substantially equal areas. Although the illustrated conductive via structure 110 or 120 shows five conductive pads, the number of conductive pads may vary according to design requirements.

The conductive via structure 110 or 120 may be made of a conductive material, such as a metallic material. For example, the conductive via structure 110 or 120 may be made of conductive metals such as copper, aluminum, gold, silver, tungsten, titanium, etc., or alloys thereof.

The semiconductor structure 100 is further provided with a conductive pad 130, which is between the conductive via structures 110 and 120 and located in one of the insulating layers D1-D4 or the conductive layers M1-M5. In the example of FIGS. 1A and 1B, the conductive pad 130 is located in the bottom conductive layer M1 where the conductive pad 114 or 124 resides. The conductive pad 130 and the conductive via structure 110 or 120 are separated from each other by the insulating material of the semiconductor structure 100 and are also insulated from each other. The conductive pad 130 may extend in the horizontal direction, which is perpendicular to the direction in which the conductive via structure 110 or 120 extends. The conductive pad 130 is separated from the conductive via structures 110 and 120 and is not electrically connected to the conductive via structures 110 and 120, and therefore the conductive pad 130 is not a part of the transmission path and does not serve the function of transmitting power or data.

Throughout the present disclosure, the term "conductive via structure" refers to at least a vertical conductive via structure including conductive vias, such as the conductive via structure 110 or 120 as shown in FIG. 1A, the two ends of the conductive via structure 110 or 120 are exposed from the substrate of the semiconductor structure 100 through the conductive pads 112, 122 in the bottom conductive layer M1 and the conductive pads 118, 128 in the top conductive pad M5, and thus it may be referred to as a conductive via structure. The conductive via structure referred to herein covers all types of conductive via structures. Therefore, the present disclosure is not limited to the conductive via structure, and can also be used for vertical conductive structures composed of blind vias or buried vias. In an embodiment, two ends of the conductive blind via structure extend to the conductive pads 112, 122 in the bottom conductive layer M1 and the conductive pads 118, 128 of the top conductive layer M5, in which only one of the two ends is exposed through the substrate of the semiconductor structure 100, while the other end is not exposed. In an embodiment, in a conductive buried via structure, neither of the two ends is exposed through the substrate of the semiconductor structure 100.

In an embodiment, the conductive pads 112, 122 and 130 may serve as crosstalk cancellers of the semiconductor structure 100. The surface of the conductive pad 130 includes a first portion having a projection overlapping area or overlapping area with the conductive pad 112 in the vertical direction, and includes a second portion having a projection overlapping area or overlapping area with the conductive pad 122 in the vertical direction. In that case, the conductive pad 112 serves as the first capacitive structure of the semiconductor structure 100 on the conductive via structure 110, and the conductive pad 122 serves as the second capacitive structure of the semiconductor structure 100 on the conductive via structure 120, and the conductive pad 130 is used as the third capacitive structure of the semiconductor structure 100, so that the projection overlapping areas or overlapping areas of the conductive pad 112 and the conductive pad 130 form a capacitor with a first mutual capacitance C1 during transmission of electrical signals, and the projection overlapping areas or overlapping areas of the conductive pad 122 and the conductive pad 130 forms a capacitor with a second mutual capacitance C2 during transmission of electrical signals. In the abovementioned capacitors generating the first mutual capacitance C1 or the second mutual capacitance C2, the conductive pad 112 or 122 serves as the first conductive plate of the capacitor, and the conductive pad 130 serves as the second conductive plate of the capacitor. The insulating material between the conductive pads 112, 122 and the conductive pad 130 serves as a dielectric layer of the capacitor, so that the capacitor stores energy in the electric field formed between the first conductive plate and the second conductive plate. In this way, the conductive via structures 110 and 120 have an equivalent mutual capacitance Ce including the first mutual capacitance C1 and the second mutual capacitance C2, and the mutual capacitance Ce is formed of the first mutual capacitance C1 and the second mutual capacitance. C2 connected in parallel. Referring to equation (1), through the arrangement of the conductive pad 130, a capacitor with mutual capacitance Ce is generated between the conductive via structures 110 and 120, thereby increasing the mutual capacitance Cm in equation (1). As a result, the effect of the FEXT is reduced.

According to the formula of a capacitor, the capacity of the capacitor is proportional to the area of the conductive plates of the capacitor. Therefore, when the projection overlapping area or overlapping area of the conductive pad 130 and the conductive pad 112 or 122 is made greater, the generated first mutual capacitance or second mutual capacitance is also made greater. The effect of the FEXT cancellation between the conductive via structure 110 and the conductive via structure 120 is also better. As shown in FIGS. 1A and 1B, the conductive pad 130 is not extended from the conductive via structure 110 or 120. In other words, the area of the conductive via structure 110 or 120 that extends in the horizontal direction is not increased for forming the crosstalk canceller. Specifically, the areas of the conductive pads 114, 115, 116, 118, 124, 125, 126 and 118 are not increased for the reason of forming the crosstalk canceller. In an embodiment, the conductive pads 112, 114, 115, 116 and 118 and the corresponding conductive pads 122, 124, 125, 126 and 118 do not project and overlap each other in the vertical direction. In other words, the mutual capacitance between the conductive via structure 110 and 120 is generated only through the conductive pad 130 as the third mutual capacitance structure. In this way, the conductive via structures 110 or 120 can not only increase the size of the mutual capacitance, but also effectively reduce or prevent the increase of insertion loss during transmission of power or data, thereby reducing the overall interference and loss of the conductive via structures 110 and 120. The transmission performance of the semiconductor structure 100 is thus enhanced.

In an embodiment, the conductive pad 130 has a circular, oval, approximately circular, elongated, polygonal, or any other shape from a top-view perspective. In an embodiment, the conductive pad 130 has a third portion in the middle area that does not cross or overlap the conductive pad 112 or 122 in the vertical direction, and the width of the third portion is greater than that of the conductive pad 130 on both sides. The widths of the crossing or overlapping first or second portions of the conductive pads 112 or 122 in the vertical direction are identical to or relatively smaller, so that the two end portions of the conductive pad 130 are wider than the middle portion in a plan view.

Figure 2A:
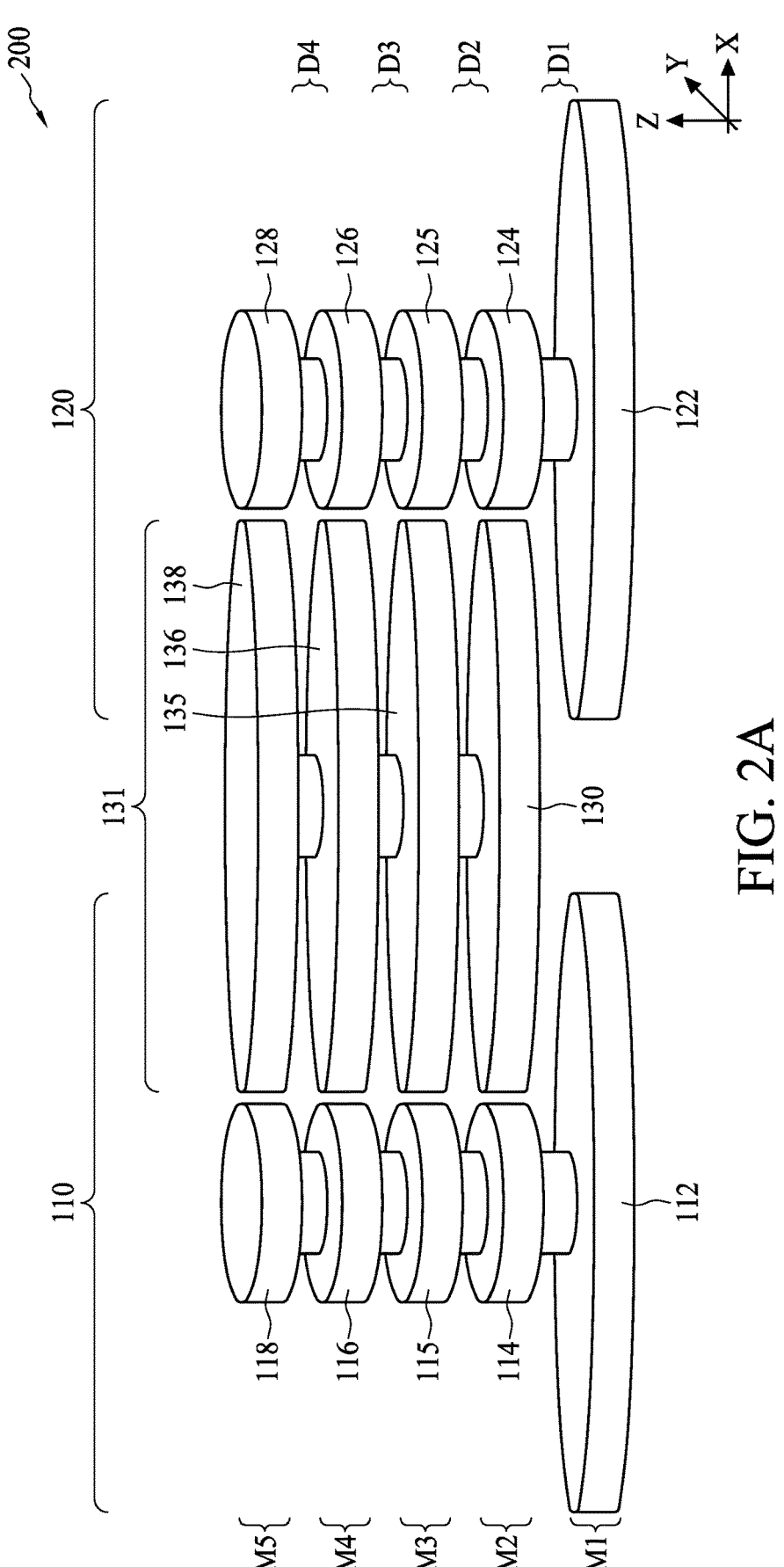
FIGS. 2A-2E are perspective views of routing paths of an example semiconductor structure, according to an embodiment of the present disclosure.

FIG. 2A is a perspective view of a routing path of an example semiconductor structure 200, according to various embodiments of the present disclosure. The semiconductor structure 200 is similar to the semiconductor structure 100 in many aspects, and therefore these similar features will not be repeated herein. The difference between the semiconductor structure 200 and the semiconductor structure 100 is that the semiconductor structure 200 includes a conductive via structure 131. The conductive via structure 131 is disposed between the conductive via structures 110 and 120 and extends through an entirety or a portion of the thickness of the semiconductor structure 100 in the vertical direction. Unlike the conductive via structure 110 or 120, the conductive via structure 131 is not a wiring that forms a transmission path in the semiconductor structure 100, but rather serves as a capacitive structure of a crosstalk canceller. In an embodiment, the length of the conductive via structure 131 is less than the length of the conductive via structure 110 or 120. In an embodiment, the conductive via structure 131 is a via structure including a blind via or a buried via, and at least one end of the conductive via structure 131 is wrapped around by the semiconductor structure 200 and not exposed from the semiconductor structure 200. The conductive via structure 131 may also be referred to herein as a conductive blind via structure or a conductive buried via structure.

As shown in FIG. 2A, the conductive via structure 131 is similar to the conductive via structures 110 and 120, for example, the conductive via structure 131 includes a plurality of vertical segments, and conductive pads are arranged between adjacent vertical segments to connect the vertical segments in the vertical direction, and the conductive pads of the conductive via structure 131 may be via pads. For example, conductive via structure 131 includes conductive pads 130, 135, 136 and 138. The conductive pads 130 of the conductive via structure 131 may have the same material, shape, location, and configuration as those of the conductive pad 130 of the semiconductor structure 100. Likewise, the conductive pads 135, 136 and 138 each have a surface extending in the horizontal direction. The respective surfaces of the conductive pads 130, 135, 136 and 138 are substantially perpendicular to the direction in which the conductive via structure 131 extends. The conductive pads 130, 135, 136 and 138 extend outward from the vertical segments of the conductive via structure 131 from a top-view perspective. Conductive pads 135, 136 and 138 may be similar in material and shape to conductive pad 130.

In an embodiment, the conductive pads 130, 135, 136 and 138 of the conductive via structure 131 are disposed in the respective insulating layers D1-D4 or the respective conductive layers M1-M5 of the semiconductor structure 200. In an embodiment, the conductive pads 130, 135, 136 and 138 and the corresponding conductive pads 114, 115, 116 and 118 of the conductive via structure 110 or the corresponding conductive pads 124, 125, 126 and 128 of the conductive via structure 120 are arranged in the same layers of the semiconductor structure 200. In an embodiment, the conductive pad 130 is located in a layer over the bottom conductive layer M1 or a layer below the top conductive layer M5 of the semiconductor structure 200. In an embodiment, the conductive pad 138 is located in a layer over the bottom conductive layer M1 or a layer below the top conductive layer M5 of the semiconductor structure 200. In an embodiment, the surface areas of conductive pads 130, 135, 136, and 138 are substantially equal.

In an embodiment, the conductive pads 130, 135, 136 and 138 in the conductive via structure 131 may serve as crosstalk cancellers together with the conductive pads 114, 115, 116 and 118 in the conductive via structure 110 and the conductive pads 124, 125, 126 and 128 in the conductive via structure 120 of the semiconductor structure 200. The conductive via structure 131 and the conductive via structure 110 or the conductive via structure 120 are separated from each other and electrically insulated from each other. The respective sidewalls of the conductive pads 130, 135, 136 and 138 have first portions opposite the sidewalls of the corresponding conductive pads 114, 115, 116 and 118, and have second portions opposite the sidewalls of the corresponding conductive pads 124, 125, 126 and 128. In other words, the first portions of the respective sidewalls of the conductive pads 130, 135, 136 and 138 are aligned with the sidewalls of the corresponding conductive pads 114, 115, 116 and 118 when viewed in the vertical direction, and the conductive pads 130, 135, 136 and 138 of the respective sidewalls of the second portions are aligned with the sidewalls of the corresponding conductive pads 124, 125, 126 and 128 when viewed in the vertical direction. In this case, each of the conductive pads 114, 115, 116, and 118 serves as the first capacitive structure, formed in the conductive via structure 110, of the semiconductor structure 100, and each of the conductive pads 124, 125, 126, and 128 serves as the second capacitive structure, formed in the conductive via structure 120, of the semiconductor structure 100, and the conductive pads 130, 135, 136 and 138 serve as the third capacitive structure, formed in the conductive via structure 131, of the semiconductor structure 100, so that the portions of opposite sidewalls of conductive via structure 110 and conductive via structure 131 form a capacitor with a third mutual capacitance C3, and portions of opposite sidewalls of conductive via structure 120 and conductive via structure 131 form a capacitor with a fourth mutual capacitance C4. In this way, an equivalent mutual capacitance Cf formed of the third mutual capacitance C3 and the fourth mutual capacitance C4 is generated between the conductive via structures 110 and 120, and the mutual capacitance Cf is formed of the third mutual capacitance C3 and the fourth mutual capacitance C4 connected in parallel. Referring to equation (1), a capacitor with the mutual capacitance Cf is created between the conductive via structures 110 and 120 through the arrangement of the conductive via structure 131, and according to the above description with respect to FIGS. 1A and 1B, the capacitor with mutual capacitance Ce is created between 110 and 120 according to the conductive pad 130. Therefore, the conductive via structure 131 provides higher mutual capacitance Cm than that provided by the conductive pad 130, and thus the FEXT can be reduced further.

Figure 2B:
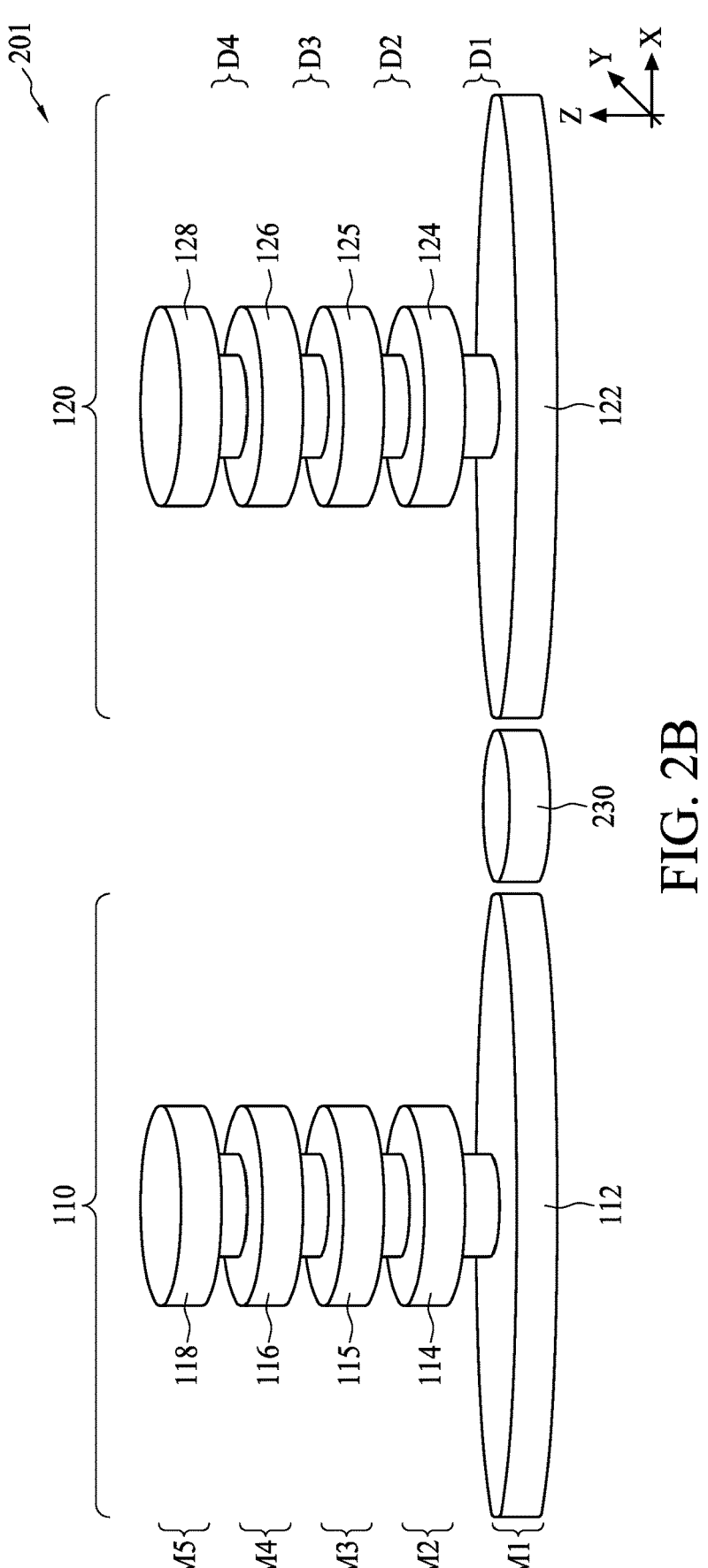

FIG. 2B is a perspective view of a routing path of an example semiconductor structure 201, according to various embodiments of the present disclosure. The semiconductor structure 201 is similar to the semiconductor structures 100, 200 in many aspects, and therefore these similar features will not be repeated herein. The semiconductor structure 201 differs from the semiconductor structure 100 mainly in that the semiconductor structure 201 includes a conductive pad 230. The conductive pad 230 is disposed between the conductive via structures 110 and 120 and extends in the horizontal direction. The conductive pad 230 is arranged in the conductive layer M1 where the conductive pad 112 or 122 is located. The conductive pad 230 and the conductive via structure 110 or 120 are separated from each other by the insulating material of the semiconductor structure 201 and are also insulated from each other. Similar to the conductive pad 130 or the conductive via structure 131, the conductive pad 230 serves as a capacitive structure of the crosstalk canceller of the semiconductor structure 201 and is not electrically connected to the conductive via structures 110 and 120, and thus the conductive pad 230 is not part of the transmission path and does not serve the function of transmitting power or data.

In an embodiment, the conductive pad 230, the conductive pad 112 of the conductive via structure 110, and the conductive pad 122 of the conductive via structure 120 altogether serve as a crosstalk canceler of the semiconductor structure 201. In an embodiment, the conductive pads 230 and the conductive pads 112 of the conductive via structure 110 and the conductive pads 122 of the conductive via structure 120 do not overlap (e.g., by projection) in the vertical direction. The sidewall of the conductive pad 230 has a first portion opposite to the sidewall of the corresponding conductive pad 112 and has a second portion opposite to the sidewall of the corresponding conductive pad 122. In other words, the first portion of the sidewall of the conductive pad 230 is horizontally aligned with the sidewall of the corresponding conductive pad 112, and the second portion of the sidewall of the conductive pad 230 is horizontally aligned with the sidewall of the corresponding conductive pad 122 aligned in the direction. In this case, the conductive pad 112 serves as a first capacitive structure, formed in the conductive via structure 110, of the semiconductor structure 201, the conductive pad 122 serves as a second capacitive structure, formed in the conductive via structure 120, of the semiconductor structure 201, and the conductive pad 230 serves as a third capacitive structure of the semiconductor structure 201, so that portions of the opposite sidewalls of the conductive via structure 110 and the conductive pad 230 form a capacitor having a fifth mutual capacitance C5, and the opposite sides of the conductive via structure 120 and the conductive pad 230 form a capacitor with a sixth mutual capacitance C6. In this way, an equivalent mutual capacitance Cg formed of the fifth mutual capacitance C5 and the sixth mutual capacitance C6 is generated between the conductive via structures 110 and 120, and the mutual capacitance Cg is formed of the fifth mutual capacitance C5 and the sixth mutual capacitance C6 connected in parallel. Referring to equation (1), the capacitor with the mutual capacitance Cg is generated between conductive via structures 110 and 120 through the arrangement of the conductive pad 230. According to the description of equation (1) above, a capacitor with mutual capacitance Cg is generated between the conductive via structure 110 and 120, which increases the mutual capacitance Cm, thereby reducing the FEXT.

Figure 2C:
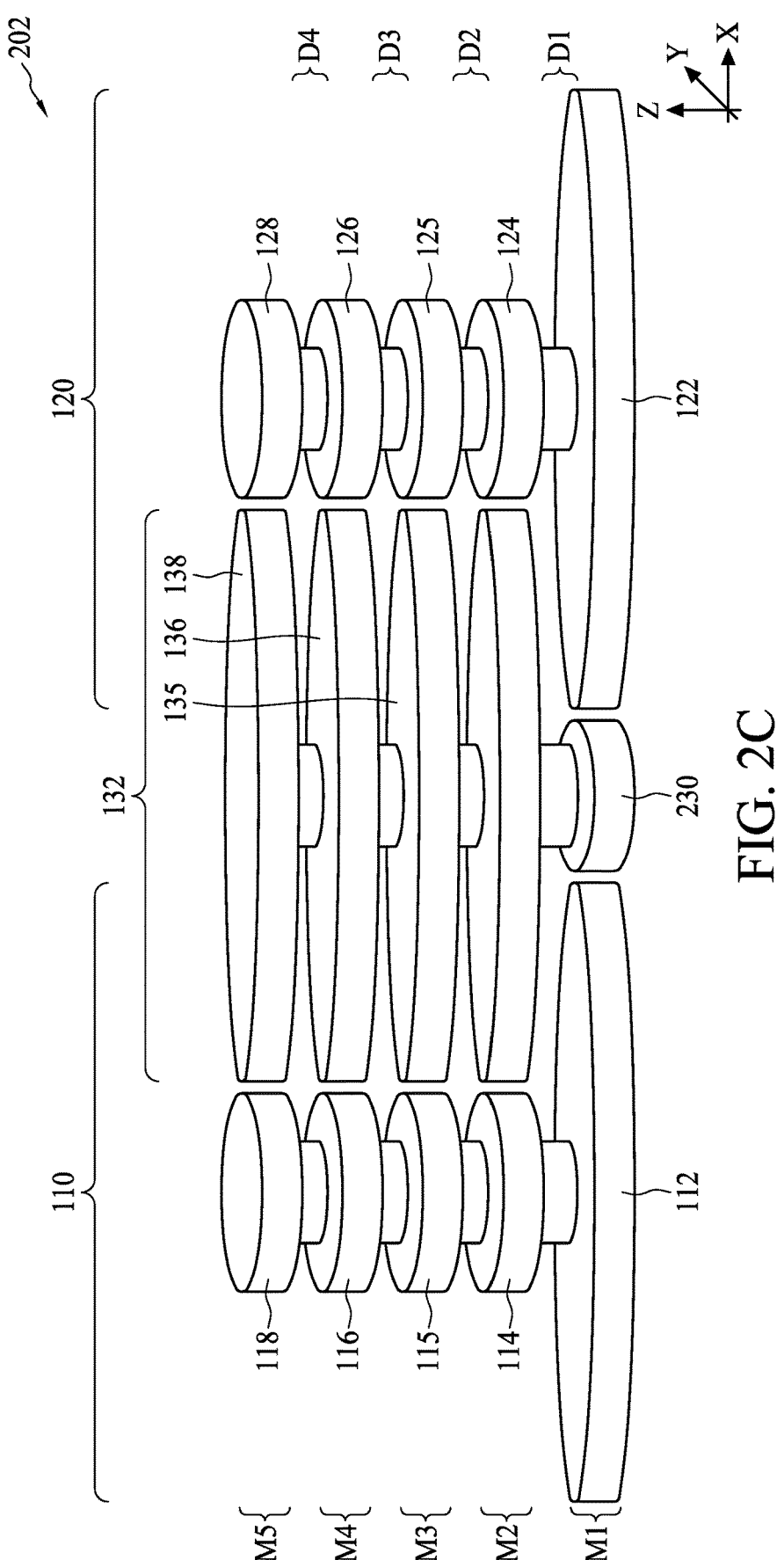

FIG. 2C is a perspective view of a routing path of an example semiconductor structure 202, in accordance with various embodiments of the present disclosure. The semiconductor structure 202 is similar to the semiconductor structures 100, 200, 201 in many aspects, and therefore these similar features will not be repeated herein. The semiconductor structure 202 can be regarded as a combination of the semiconductor structures 200 and 201, wherein the semiconductor structure 202 includes a conductive via structure 132 disposed between the conductive via structures 110 and 120 and extending in the vertical direction. The conductive via structure 132 is similar to the conductive via structure 131 and serves as a capacitive structure in a crosstalk canceller of the semiconductor structure 202. The conductive structure 132 is not electrically connected to the conductive via structures 110 and 120, thus it does not serve the function of transmitting power or data. The conductive via structure 132 includes a plurality of vertical segments, and conductive pads are arranged between the vertical segments to connect adjacent vertical segments in the vertical direction, and the conductive pads of the conductive via structure 132 may be via pads. For example, conductive via structure 131 includes conductive pads 230, 130, 135, 136 and 138.

Based on the above description of the conductive pads 230 and the conductive via structure 131, the conductive pads 230, 130, 135, 136 and 138 in the conductive via structure 131 can serve as a crosstalk canceler of the semiconductor structure 200 together with the conductive pads 112, 114, 115, 116 and 118 of the conductive via structure 110 and the conductive pads 122, 124, 125, 126 and 128 of the conductive via structure 120. Referring to equation (1), through the arrangement of the conductive via structure 132, at least capacitors with the mutual capacitances Cf and Cg are generated between the conductive via structures 110 and 120. Therefore, the conductive via structure 132 provides greater mutual capacitance Cm than that provided by the conductive pads 130, 230 or the conductive via structure 131 alone, and thus the FEXT can be reduced a step further.

Figure 2D:
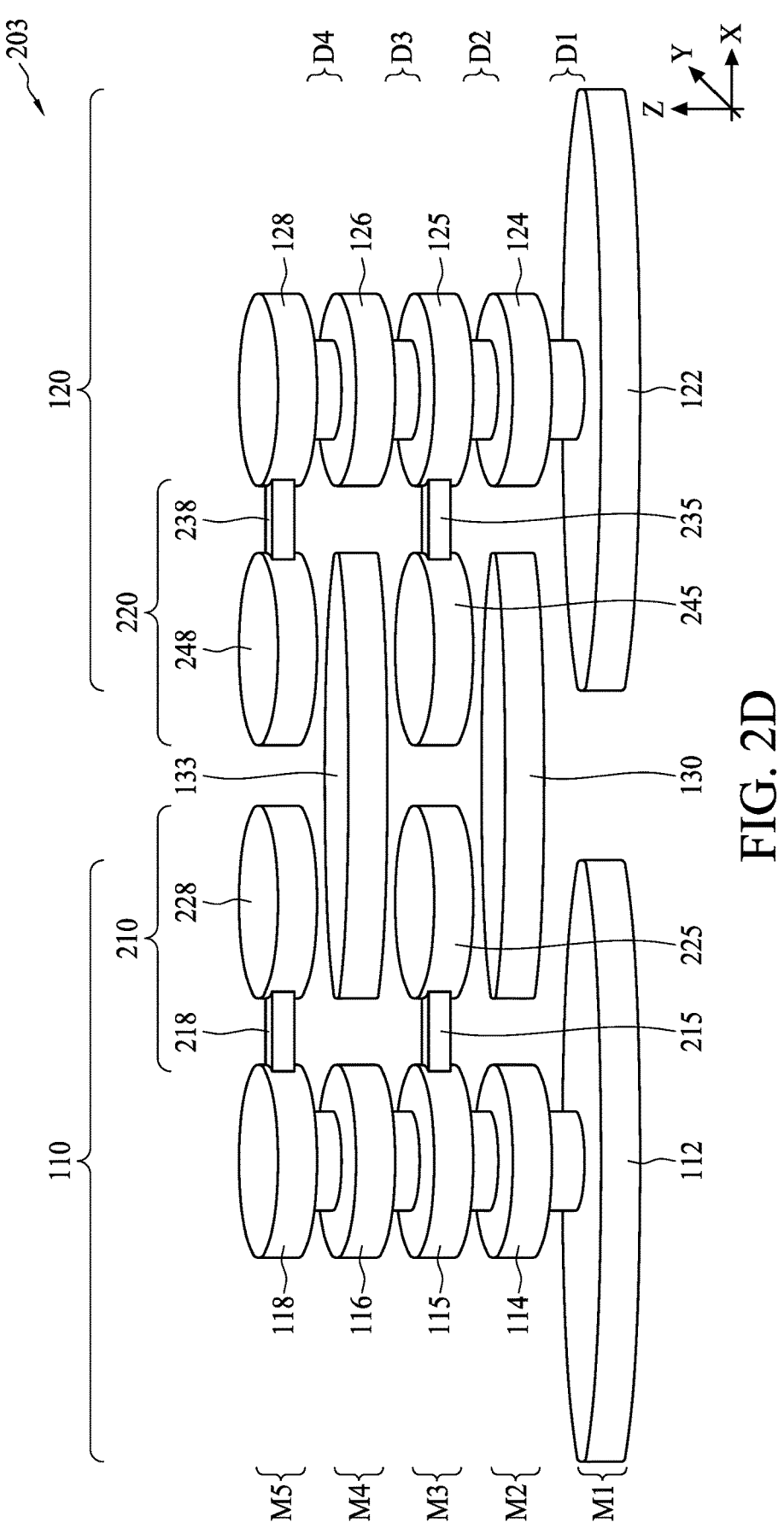

FIG. 2D is a perspective view of a routing path of an example semiconductor structure 203, according to various embodiments of the present disclosure. The semiconductor structure 203 is similar to the semiconductor structures 100, 200, 201, 202 in many aspects, and therefore these similar features are not repeated herein. The semiconductor structure 203 includes a conductive pad 133 between the conductive via structures 110 and 120 and extends in the horizontal direction. The conductive pad 133 is similar to the conductive pad 130 and serves as a capacitive structure in a crosstalk canceller of the semiconductor structure 203. The conductive pad 133 is not electrically connected to the conductive via structures 110 and 120, thus it does not serve the function of transmitting power or data. In an embodiment, the conductive pad 133 and the conductive pad 130 are separated from each other, located in different layers and overlap with projection or overlap in the vertical direction. In other embodiments, the conductive pad 133 and the conductive pad 130 may completely overlap, partially overlap or not overlap at all in the vertical direction. The conductive pad 133 may be located in the same layer as the conductive pad 116 of the conductive via structure 110 or the conductive pad 126 of the conductive via structure 120.

Referring to FIG. 2D, the conductive via structure 110 includes an extension portion 210 extending outward in the horizontal direction from one or more conductive pads. In an embodiment, the extension portion 210 extends toward the conductive via structure 120 in the horizontal direction. The extension portion 210 may include a connection portion and a conductive pad. For example, the extending portion 210 is provided with a connecting portion 215 and a conductive pad 225 in the layer where the conductive pad 115 resides, and a connecting portion 218 and a conductive pad 228 are provided in the layer where the conductive pad 118 resides. The connecting portions 215, 218 and the conductive pads 225, 228 can be made of conductive materials, such as copper, aluminum, gold, silver, tungsten, titanium and other conductive metals or alloys thereof. The connecting portion 215 or 218 may have a shape of sheet, a rod or a strip, and may extend from one side of the conductive pad 115 or 118 to be connected to the conductive pad 225 or 228. The conductive pads 225 or 228 may have be circular, oval, approximately circular, polygonal, or have any other shape from a top-view perspective.

The conductive via structure 110 can increase the exposed area in the vertical direction through the extension portion 210, in addition to the conductive pad 112. For example, the conductive pads 225 or 228 may be considered conductive pads extending outward from the conductive pads 115 or 118 of the conductive via structure 110. In an embodiment, the conductive pad 225 or 228 has a substantially equal area as that of the conductive pad 114, 115, 116 or 118. The conductive pads 130 or 133 each have a first portion that overlaps in projection or overlaps the conductive pads 225 or 228 in the vertical direction.

Similarly, the conductive via structure 120 includes an extension portion 220 extending horizontally outward from one or more conductive pads. In an embodiment, the extension portion 220 extends toward the conductive via structure 110 in the horizontal direction. The extension portion 220 may include a connecting portion and a conductive pad. For example, the extending portion 220 is provided with the connecting portion 235 and the conductive pad 245 in the layer where the conductive pad 125 resides, and the connecting portion 238 and the conductive pad 248 are provided in the layer where the conductive pad 128 is located. The connection portion 235 or 238 and the conductive pads 245 or 248 may be made of conductive materials, such as copper, aluminum, gold, silver, tungsten, titanium and other conductive metals or alloys of the above materials. The connecting portion 235 or 238 may have a shape of sheet, a rod shape or a strip, and may extend from one side of the conductive pad 125 or 128 to be connected to the conductive pad 245 or 248. The conductive pad 245 or 248 may be circular, oval, approximately circular, polygonal, or have any other shape from a top-view perspective.

The conductive via structure 120 can increase the exposed area in the vertical direction through the extension portion 220, in addition to the conductive pad 122. For example, a conductive pad 245 or 248 may be considered conductive pads extending outward from the conductive pads 125 or 128 of the conductive via structures 120. In an embodiment, the conductive pad 245 or 248 has a substantially equal area as that of the conductive pads 124, 125, 126 or 128. The Conductive pads 130 or 133 each have a second portion that overlaps in projection or overlaps the conductive pad 245 or 248 in the vertical direction.

The conductive pads 130, 133, the conductive pads 225, 228 of the conductive via structure 110, and the conductive pads 245, 248 of the conductive via structure 120 may serve as crosstalk cancelers of the semiconductor structure 203. The respective surfaces of the conductive pads 130, 133 have a first portion with an overlapping area with projection or an overlapping area with the conductive pads 225, 228 in the vertical direction, and have a second portion with an overlapping area with projection or an overlapping area with the conductive pads 245, 248 in the vertical direction. In that case, at least one of the conductive pads 225, 228 serves as a first capacitive structure, formed in the conductive via structure 110, of the semiconductor structure 203, and at least one of the conductive pads 245, 248 serves as a second capacitive structure, formed in the conductive via structure 120, of the semiconductor structure 203, and at least one of the conductive pads 130, 133 serves as a third capacitive structure of semiconductor structure 203. As a result, the projected overlapping area or the overlapping area between at least one of the conductive pads 225, 228 and at least one of the conductive pads 130, 133 forms a capacitor with a seventh mutual capacitance C7, and the projected overlapping area or the overlapping area between at least one of the conductive pads 245, 248 and at least one of the conductive pads 130, 133 forms a capacitor with an eighth mutual capacitance C8. In this way, an equivalent mutual capacitance Ch formed of the seventh mutual capacitance C7 and the eighth mutual capacitance C8 is generated between the conductive via structures 110 and 120, and the mutual capacitance Ch is formed of the seventh mutual capacitance C7 and the eighth mutual capacitance. C8 connected in parallel. Referring to equation (1), through the arrangement of the conductive pads 130, 133 and conductive pads 225, 228, 245, 248, a capacitor with the mutual capacitance Ch is generated between conductive via structures 110 and 120. Therefore, the mutual capacitance Cm shown in equation (1) is increased due to the generation of the capacitor with the mutual capacitance Ch, and thus the FEXT can be reduced.

Since the capacitance of a capacitor is proportional to the size of the conductive plate of the capacitor, when the projected overlapping area or the overlapping area between the conductive pad 130 or 133 and the conductive pad 225, 228, 245, 248 is made greater, the resultant seventh mutual capacitance C7 or the eighth mutual capacitance C8 will also be made greater, and the performance of eliminating the FEXT between the conductive via structure 110 and the conductive via structure 120 will also be better. With help of the area of the extension portions 210 and 220 in the horizontal direction, the area of the conductive via structure 110 or 120 is appropriately increased when viewed in the vertical direction, and the conductive via structure 110 or 120 forms a of mutual capacitance inducing capacitive structure with the conductive pads 130 and 133 that are formed separately, which can greatly increase the capacitor area for the seventh mutual capacitance C7 or the eighth mutual capacitance C8. In this way, the conductive via structure 110 or 120 not only increases the mutual capacitance, but also manages the insertion loss within a reasonable range during power or data transmission, thereby reducing the overall FEXT between the conductive via structures 110 and 120. The effects of interference and loss are improved, and the transmission performance of the semiconductor structure 203 is improved.

Figure 2E:
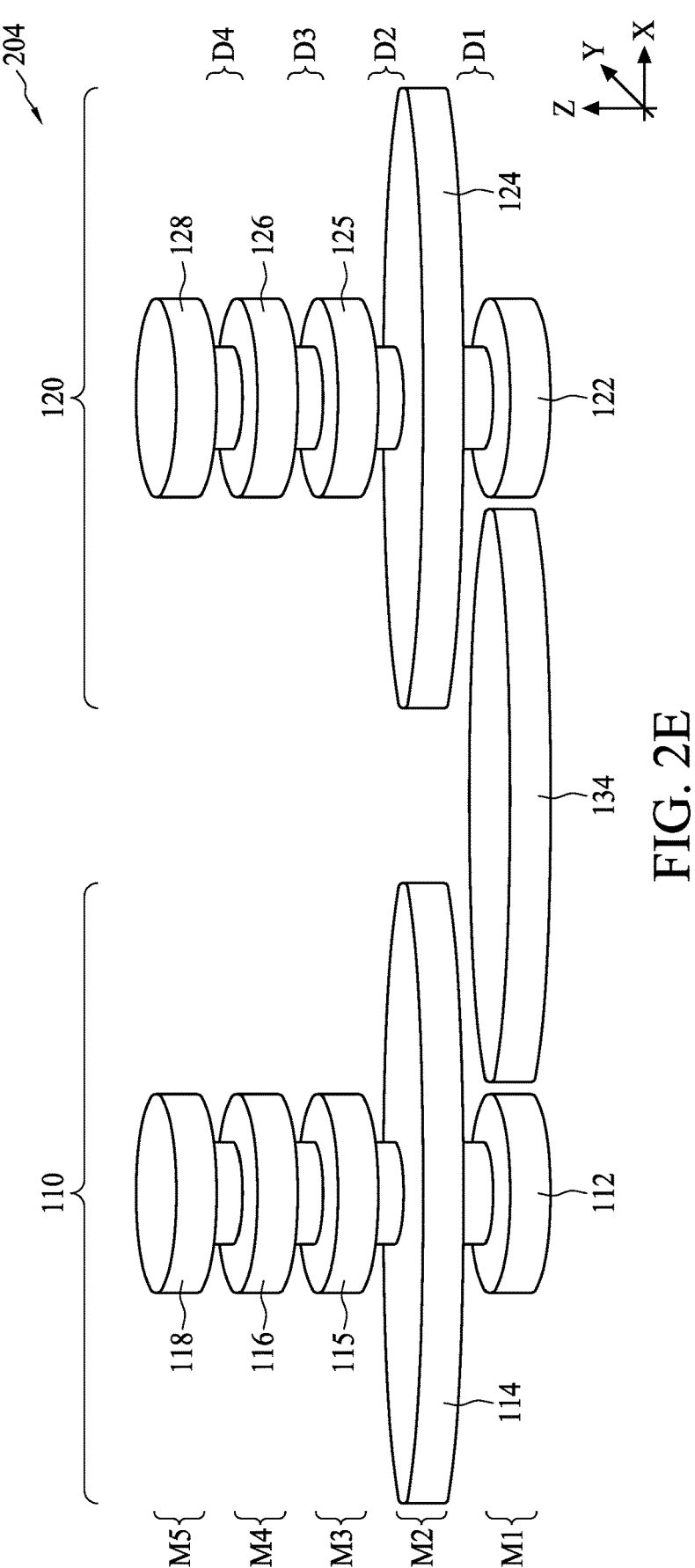

FIG. 2E is a perspective view of a routing path of an example semiconductor structure 204, in accordance with various embodiments of the present disclosure. The semiconductor structure 204 is similar to the semiconductor structures 100, 200 in many aspects, and therefore these similar features are not repeated herein. The difference between the semiconductor structure 204 and the semiconductor structure 100 is mainly in that in the semiconductor structure 203, the conductive pad 114, that serves as the first capacitive structure, is arranged between the conductive pad 112 and the conductive pad 116, and the conductive pad 124, that serves as the second capacitive structure, is arranged between the conductive pad 122 and the conductive pad 126. In an embodiment, the conductive pads 114, 124 are arranged in the top conductive layer M5, the bottom conductive layer M1, or at any conductive layer between the top conductive layer M5 and the bottom conductive layer M1, of the substrate of the semiconductor structure 203. In an embodiment, the area of the conductive pad 114 is the greatest among all the conductive pads of the conductive via structure 110, or is greater than the areas of other conductive pads of the conductive via structure 110, and the area of the conductive pad 124 is the greatest among all the conductive pads of the conductive via structure 120, or is greater than the areas of other conductive pads of the conductive via structure 120.

The conductive pad 134 is arranged between the conductive via structures 110 and 120 and extends in the horizontal direction. The conductive pad 134 is arranged in the conductive layer M1 where the conductive pad 112 or 122 resides. The conductive pad 134 and the conductive via structure 110 or 120 are separated from each other by the insulating material of the semiconductor structure 203 and are also insulated from each other. Similar to the conductive pad 130, the conductive pad 134 serves as a capacitive structure in the crosstalk canceller of semiconductor structure 203 and is not electrically connected to the conductive via structures 110 and 120, and thus is not part of the transmission path and does not serve the function of transmitting power or data.

In an embodiment, the conductive pads 114, 124 and 134 may serve as crosstalk cancellers of the semiconductor structure 203. The surface of the conductive pad 134 has a first portion having a projected overlapping area or overlapping area with the conductive pad 114 in the vertical direction, and a second portion having a projected overlapping area or overlapping area with the conductive pad 124 in the vertical direction. In that case, the conductive pad 114 serves as the first capacitive structure of the semiconductor structure 203 on the conductive via structure 110, and the conductive pad 124 serves as the second capacitive structure of the semiconductor structure 203 on the conductive via structure 120, and the conductive pad 134 serves as the third capacitive structure of the semiconductor structure 203, so that the overlapping area between the conductive pad 114 and the projection overlapping area of the conductive pad 134 forms a capacitor with a ninth mutual capacitance C9 during transmission of electrical signals, and the projected overlapping area or the overlapping area between the conductive pad 124 and the conductive pad 134 forms a capacitor with a tenth mutual capacitance C10 during transmission of electrical signals. In the abovementioned capacitors generating the ninth mutual capacitance C9 or the tenth mutual capacitance C10, the conductive pad 114 or 124 serves as the first conductive plate of the capacitor, the conductive pad 134 serves as the second conductive plate of the capacitor, and the insulating material between the conductive pads 134 and the conductive pads 114, 124 serves as the dielectric layer of the capacitor, so that the capacitor stores energy in the electric field formed between the first conductive plate and the second conductive plate. In this way, an equivalent mutual capacitance Ci formed of the ninth mutual capacitance C9 and the tenth mutual capacitance C10 is generated between the conductive via structures 110 and 120, and the mutual capacitance Ci is formed of the ninth mutual capacitance C9 and the tenth mutual capacitance C10 connected in parallel. Referring to equation (1), through the arrangement of the conductive pad 134, a capacitor with the mutual capacitance Ci is generated between the conductive via structures 110 and 120. Therefore, the mutual capacitance Cm in equation (1) is increased, and thus the FEXT can be reduced.

In an embodiment, the conductive pad 134, the conductive pad 112 of the conductive via structure 110, and the conductive pad 122 of the conductive via structure 120 serve as a crosstalk canceler for the semiconductor structure 203. In an embodiment, the conductive pads 134 and the conductive pads 112 of the conductive via structure 110 and the conductive pads 122 of the conductive via structure 120 do not overlap in projection in in the vertical direction. The sidewalls of the conductive pads 134 have a first portion opposite the sidewall of the corresponding conductive pad 112 and have a second portion opposite the sidewall of the corresponding conductive pad 122. In other words, the first portion of the sidewall of the conductive pad 134 is aligned with the sidewall of the corresponding conductive pad 112 in the horizontal direction, and the second portion of the sidewall of the conductive pad 134 is aligned with the sidewall of the corresponding conductive pad 122 aligned in the horizontal direction. In that case, the conductive pad 112 serves as the first capacitive structure of the semiconductor structure 203 on the conductive via structure 110, the conductive pad 122 serves as the second capacitive structure of the semiconductor structure 201 on the conductive via structure 120, and the conductive pad 134 serves as the third capacitive structure of the semiconductor structure 203, so that portions of the opposite sidewalls of the conductive via structure 110 and the conductive pad 134 form a capacitor with an eleventh mutual capacitance C11, and portions of opposite sidewalls of the conductive via structure 120 and the conductive pad 134 the walls form a capacitor with a twelfth mutual capacitance C12. In this way, an equivalent mutual capacitance Cj formed of the eleventh mutual capacitance C11 and the twelfth mutual capacitance C12 is generated between the conductive via structures 110 and 120, and the mutual capacitance Cj is formed of the eleventh mutual capacitance C11 and the twelfth mutual capacitance C12 connected in parallel. Referring to equation (1), through the arrangement of the conductive pad 134, a capacitor with mutual capacitance Cj is generated between the conductive via structures 110 and 120. Referring to equation (1), the capacitor with the mutual capacitance Cj is generated between the conductive via structures 110 and 120. The mutual capacitance Cm is increased, and thus the FEXT is reduced.

Figure 3A:
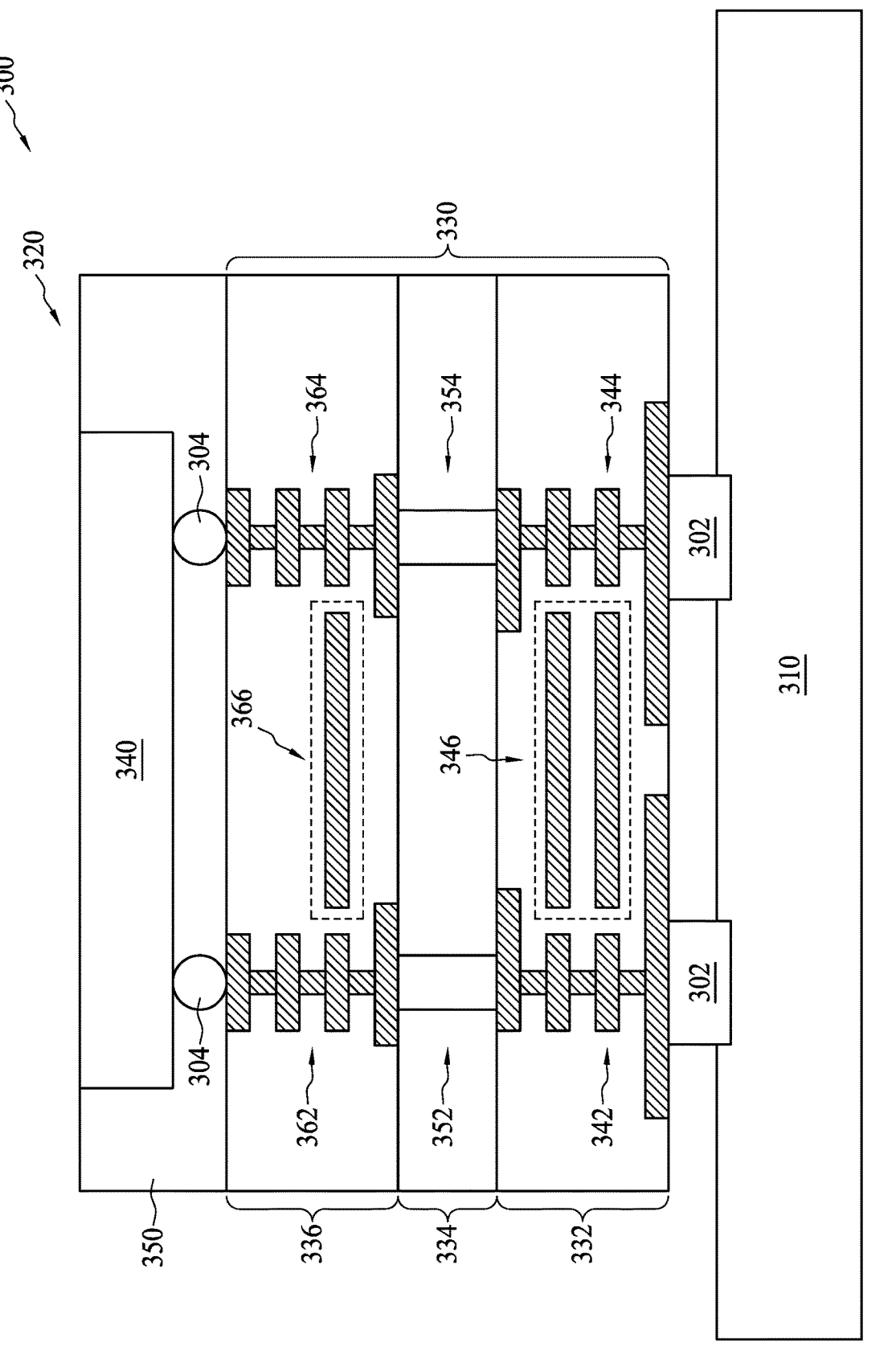
FIGS. 3A and 3B are different cross-sectional views of an example electronic device, according to an embodiment of the present disclosure.

FIG. 3A is a cross-sectional view of an example electronic device 300, according to an embodiment of the present disclosure. The electronic device 300 serves as an integrated system for implementing the conductive via structures, as described in FIGS. 1A and 1B and 2A-2D above, in various locations in routing path of the data transmission path or power transmission path of a device, a system or package, such as a substrate, a socket, a printed circuit board, a die or a chip.

The electronic device 300 includes a printed circuit board 310 and a package structure 320. The printed circuit board 310 and the package structure 320 are electrically connected through connectors 302, wherein the connectors 302 can be conductive bumps, conductive pads, interconnect structures, or pin sockets, such as ball grid array (BGA), Pin Grid Array (PGA) or Land Grid Array (LGA). The package structure 320 includes a substrate 330 and a chip 340, and the chip 340 and the printed circuit board 310 are electrically connected through the connectors 304 and a data transmission path or a power transmission path in the substrate 330. The chip 340 may be a die or another package. In an embodiment, the connectors 304 can be conductive bumps, conductive pads, or interconnect structures, or pin sockets, such as BGA, PGA, or LGA. In an embodiment, the electronic device 300 further includes a molding material 350 for molding the chip 340 and the connectors 304.

In an embodiment, the substrate 330 has a multi-layered structure, for example, including a first stacked layer 332, a core layer 334 and a second stacked layer 336 to form a multi-layered transmission structure. In an embodiment, the first stack layer 332 or the second stack layer 336 is formed by stacking a plurality of insulating layers or conductive layers alternately arranged with each other. In an embodiment, the core layer 334 has one or more through vias 352 and 354 electrically connected to the first stack layer 332 and the second stack layer 336. The substrate 330 is configured to form a data or power transmission path between the connectors 302 and the connectors 304, and may be implemented by one or more conductive via structures extending in the vertical direction. For example, the first stacked layer 332 includes a conductive via structure 342 and a conductive via structure 344, and the second stacked layer 336 includes a conductive via structure 362 and a conductive via structure 364. The conductive via structure 342 and the conductive via structure 362 are electrically connected through the through vias 352 of the core layer 334, and the conductive via structure 344 and the conductive via structure 364 are electrically connected through the through vias 354 of the core layer 334.

In an embodiment, the first stack layer 332 is further provided with a capacitive structure 346 so that a mutual capacitance is generated between the capacitive structure 346 and the conductive via structures 342 and 344, thereby reducing or eliminating the far-end crosstalk between the conductive via structure 342 and the conductive via structure 344. The capacitive structure 346 may be implemented according to the conductive pad 130 shown in FIG. 1A-1B or the conductive pad 230, the conductive pad 133, and the conductive via structures 131, 132 shown in FIGS. 2A-2D. The first stack layer 332 can be designed according to the crosstalk canceller shown in FIGS. 1A-1B or FIGS. 2A-2D so that a mutual capacitance is generated between the capacitive structure 346 and the conductive via structures 342 and 344, thereby reducing or eliminating far-end crosstalk between the conductive via structure 342 and the conductive via structure 344. In addition, although not shown in FIG. 3A, the conductive via structures 342 and 344 of the first stack layer 332 can further include the extension portions 210 and 220 with reference to the conductive via structures 110 and 120 shown in FIG. 2D so that a mutual capacitance between the conductive via structures 342, 344 and capacitive structure 346 is generated, thereby reducing or eliminating far-end crosstalk between the conductive via structure 342 and the conductive via structure 344.

In an embodiment, the second stack layer 336 is further provided with a capacitive structure 366 so that a mutual capacitance is generated between the capacitive structure 366 and the conductive via structures 362 and 364, thereby reducing or eliminating the far-end crosstalk between the conductive via structure 362 and the conductive via structure 364. The capacitive structure 366 may be implemented according to the conductive pad 130 shown in FIG. 1A-1B or the conductive pad 230, the conductive pad 133, and conductive via structures 131, 132 shown in FIGS. 2A-2D. The second stack layer 336 be designed according to the crosstalk canceler design of FIGS. 1A-1B or FIGS. 2A-2D so that a mutual capacitance is generated between the capacitive structure 366 and the conductive via structures 362, 364, thereby reducing or eliminating the far-end crosstalk between the conductive via structure 362 and the conductive via structure 364. In addition, although not shown in FIG. 3A, the conductive via structures 362 and 364 of the second stack layer 336 can further include the extension portions 210 and 220 with reference to the conductive via structures 110 and 120 shown in FIG. 2D so that a mutual capacitance between the conductive via structures 362, 364 and capacitive structure 366 is generated, thereby reducing or eliminating far-end crosstalk between the conductive via structure 362 and the conductive via structure 364.

The capacitive structures 346 and 366 of the electronic device 300 shown in FIG. 3A are merely exemplary crosstalk cancellers. The electronic device 300 may further include, depending on requirements, one or more conductive pads or conductive via structures to serve as the crosstalk cancellers between a plurality of conductive via structures among which far-end crosstalk occurs, in which the crosstalk cancellers are separate and electrically insulated from the existing conductive via structures, and mutual capacitances are generated between the existing conductive via structures, thereby eliminating or reducing the far-end crosstalk of adjacent or closely arranged conductive via structures.

Figure 3B:
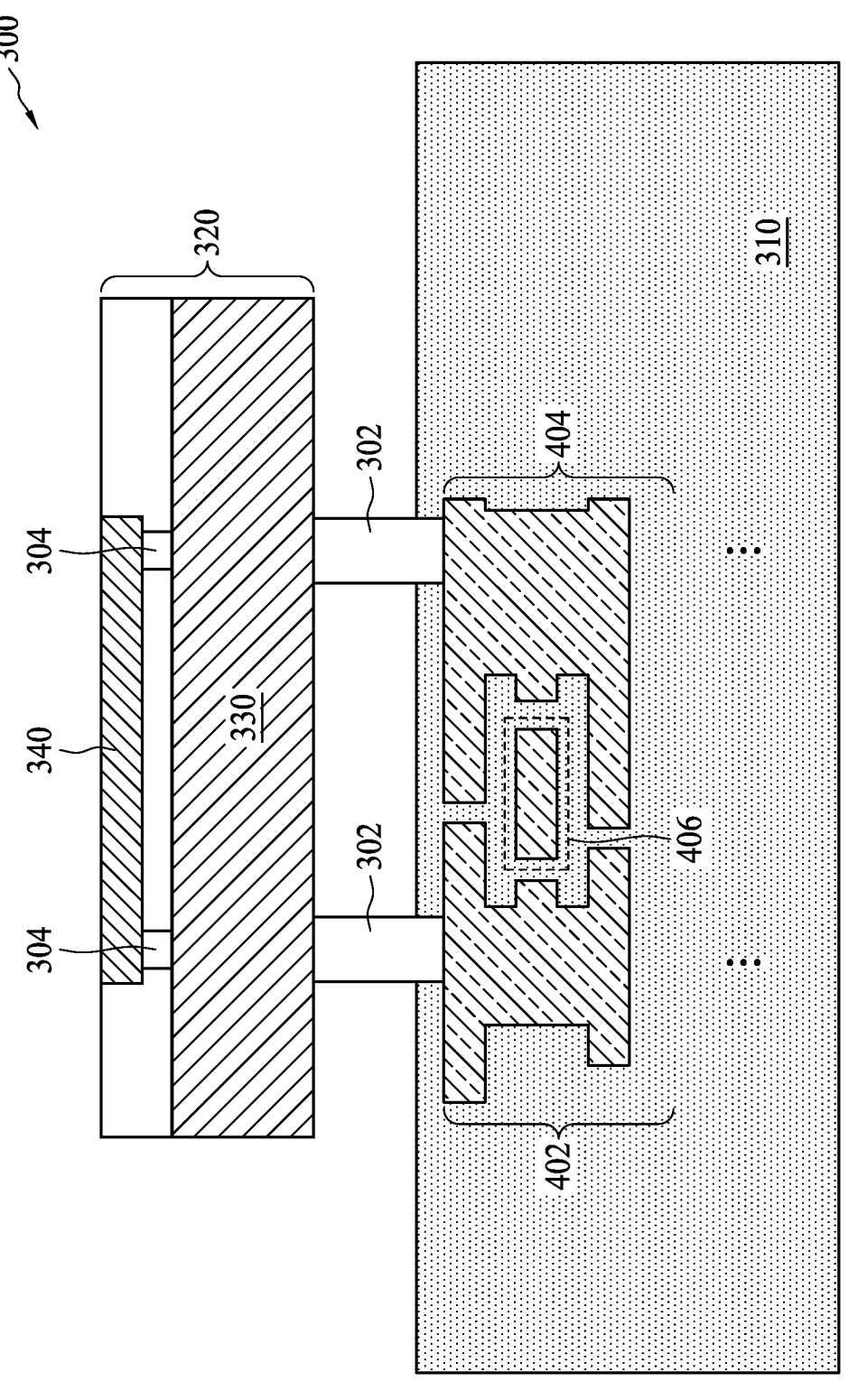

FIG. 3B is an enlarged cross-sectional view of the printed circuit board 310 of the electronic device 300. The printed circuit board 310 is provided with conductive via structures 402 and 404 near the surface facing the package structure 320 to electrically connect to the corresponding connectors 302. The conductive via structures 402 and 404 are components used to electrically connect the chip 340 to the printed circuit board 310 through the package structure 320 and the connectors 302. The conductive via structures 402 and 404 may be data transmission paths or power transmission paths. The printed circuit board 310 is further provided with a capacitive structure 406, insulated from the conductive via structures 402 and 404, and a mutual capacitance generated between the capacitive structure 406 and the conductive via structures 402, 404. The capacitive structure 406 may be implemented according to the conductive pad 130 shown in FIG. 1A-1B, or conductive pad 230, the conductive pad 133, or the conductive via structures 131, 132 shown in FIGS. 2A-2D. The conductive via structures 402, 404 can be designed according to the crosstalk canceller shown in FIG. 1A-1B or 2A-2D so that a mutual capacitance can be generated between the capacitive structure 406 and the conductive via structures 402, 404, thereby reducing or eliminating the far-end crosstalk between the conductive via structure 402 and the conductive via structure 404. In addition, although not shown in FIG. 3A, the conductive via structures 402 and 404 can further include the extension portions 210 and 220 with reference to the conductive via structures 110 and 120 shown in FIG. 2D so that a mutual capacitance is generated between the conductive via structures 402, 404 and capacitive structure 406, thereby reducing or eliminating far-end crosstalk between the conductive via structure 402 and the conductive via structure 404.

Figure 4:
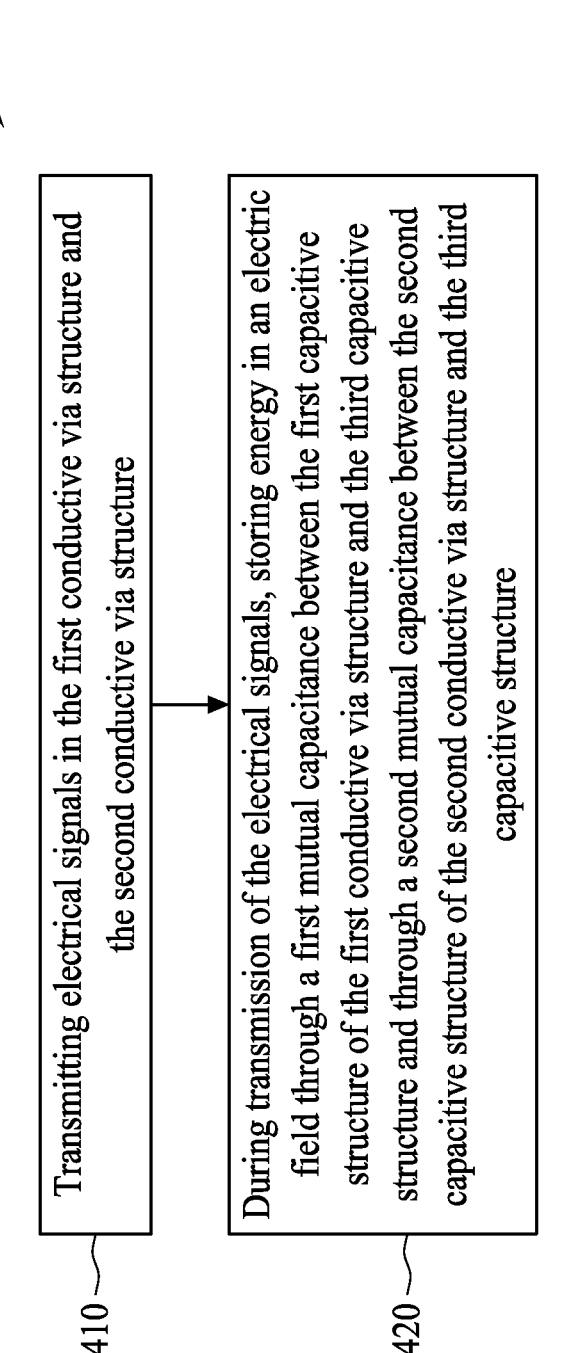
FIG. 4 is a flowchart of an example method of crosstalk cancellation, according to an embodiment of the present disclosure.

FIG. 4 is a flowchart of an example method 400 of crosstalk cancellation, according to an embodiment of the present disclosure. In an embodiment, the method 400 is performed via an electronic device or semiconductor structure shown in the preceding figures. The embodiments of the present application are not limited to the method of FIG. 4, and one or more steps may be added, omitted, rearranged or modified in other embodiments.

In step 410, the electronic device or semiconductor structure transmits electrical signals in at least two or more conductive via structures, for example, in the first conductive via structure and the second conductive via structure. The electrical signal may include a data signal or a clock signal. The electrical signal may be a digital signal or an analog signal.

In an embodiment, the step 410 transmits electrical signals through the conductive via structures shown in FIG. 1A-1B, 2A-2D, or 3A-3B. The plurality of conductive via structures are adjacent to each other, and therefore crosstalk, e.g., the far-end crosstalk, may occur between the adjacent conductive via structures.

At step 420, during transmission of the electrical signals, a first crosstalk canceller is formed by the first capacitive structure of the first conductive via structure and the third capacitive structure of the semiconductor structure, through which energy is stored in the electric field through a first mutual capacitance generated by the first crosstalk canceller. and a second crosstalk canceller is formed by the second capacitive structure of the second conductive via structure and the third capacitive structure of the semiconductor structure, through which energy is stored in the electric field through a second mutual capacitance generated by the second crosstalk canceller For example, as shown in FIGS. 1A-1B, the semiconductor structure 100 includes the first capacitive structure 112 of the conductive via structure 110 and the second capacitive structure 122 of the second conductive via structure 120 as part of the crosstalk canceller, and the third capacitive structure 130 as part of the crosstalk canceller. The first mutual capacitance is generated between the first capacitive structure 112 and the third capacitive structure 130, and the second mutual capacitance is generated between the second capacitive structure 122 and the third capacitive structure 130. As a result, the far-end crosstalk between the conductive via structures 110 and 120 is reduced or eliminated through the mutual capacitance formed by the first mutual capacitance and the second mutual capacitance.

In the above-mentioned embodiment, the steps 410 and 420 of the method 400 are described as performed sequentially. However, it should be understood that, in an embodiment, the steps 410 and 420 are substantially performed simultaneously in the semiconductor structure shown above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate, comprising a plurality of conductive layers and a plurality of insulating layers stacked alternately with each other along a vertical direction of the substrate;
a first conductive via structure extending from a top conductive layer of the plurality of conductive layers to a bottom conductive layer of the plurality of conductive layers and including a first capacitive structure, the first capacitive structure extending in a first conductive layer of the plurality of conductive layers;
a second conductive via structure extending from the top conductive layer to the bottom conductive layer and including a second capacitive structure extending in the first conductive layer; and a third capacitive structure extending in the first conductive layer or a second conductive layer of the plurality of conductive layers, wherein the third capacitive structure forms a first mutual capacitance with the first capacitive structure and a second mutual capacitance with the second capacitive structure,
wherein the plurality of insulating layers comprise a top insulating layer and a bottom insulating layer, wherein each of the first conductive via structure and the second conductive via structure extends through the top insulating layer and the bottom insulating layer, wherein the third capacitive structure is fully encapsulated by the insulating layers and is free from being electrically connected to any conductive element extending through the top insulating layer or the bottom insulating layer.

2. The semiconductor structure of claim 1, wherein the first capacitive structure and the second capacitive structure do not overlap in projection in the vertical direction.

3. The semiconductor structure of claim 1, wherein the third capacitive structure is overlapped in projection with the first capacitive structure and the second capacitive structure in the vertical direction.

4. The semiconductor structure of claim 1, wherein the third capacitive structure is symmetric about a central line of the third capacitive structure from a cross-sectional view.

5. The semiconductor structure of claim 1, wherein the first conductive layer is arranged in the top conductive layer or another conductive layer between the top conductive layer and the bottom conductive layer.

6. The semiconductor structure of claim 1, wherein the third capacitive structure comprises a first conductive pad arranged in a conductive layer same as the first capacitive structure and the second capacitive structure.

7. The semiconductor structure of claim 6, wherein the first capacitive structure comprises a second conductive pad, the first conductive via structure further comprises a third conductive pad arranged in a third conductive layer of the plurality of conductive layers, wherein an area of the second conductive pad is greater than an area of the third conductive pad.

8. The semiconductor structure of claim 7, wherein the first conductive via structure further comprises a fourth conductive pad arranged in the third conductive layer, wherein the third conductive pad and the fourth conductive pad are connected through a connecting portion, and wherein the third capacitive structure and the fourth conductive pad form a third mutual capacitance.

9. The semiconductor structure of claim 8, wherein the second conductive via structure further comprises a fifth conductive pad arranged in the third conductive layer, wherein the third capacitive structure forms a fourth mutual capacitance with the fifth conductive pad.

10. The semiconductor structure of claim 9, wherein the fourth conductive pad and the fifth conductive pad do not overlap in projection in the vertical direction.

11. The semiconductor structure of claim 1, wherein the third capacitive structure and the first capacitive structure or the second capacitive structure do not overlap in projection in the vertical direction.

12. The semiconductor structure of claim 1, wherein the third capacitive structure forms the first mutual capacitance with the first capacitive structure arranged in the first conductive layer and the second mutual capacitance with the second capacitive structure arranged in the first conductive layer.

13. The semiconductor structure of claim 1, further comprising a fourth capacitive structure, wherein the third capacitive structure and the fourth capacitive structure are arranged in different layers of the plurality of conductive layers, wherein the fourth capacitive structure forms a fifth mutual capacitance with the first conductive via structure and forms a sixth mutual capacitance with the second conductive via structure.

14. The semiconductor structure of claim 13, wherein the third capacitive structure is electrically insulated from the fourth capacitive structure.

15. The semiconductor structure of claim 13, wherein the third capacitive structure and the fourth capacitive structure overlap in projection, partially overlap in projection, or do no overlap in projection in the vertical direction.

16. The semiconductor structure of claim 13, wherein the first via structure comprises a sixth conductive pad, wherein the fourth capacitive structure and the sixth conductive pad are arranged in a same conductive layer of the plurality of conductive layers, wherein the fourth capacitive structure and the sixth conductive pad form a seventh mutual capacitance.

17. An electronic device, comprising:

the semiconductor structure according to claim 1;

a printed circuit board arranged on a first side of the semiconductor structure and adjacent to the bottom conductive layer of the semiconductor structure;

a connector between the printed circuit board and the semiconductor structure; and a chip on a second side of the semiconductor structure opposite the first side and adjacent to the top conductive layer of the semiconductor structure, wherein the printed circuit board is electrically connected to the chip through the connector and the first conductive via structure and the second conductive via structure of the semiconductor structure.

18. A method of crosstalk cancellation, comprising:

transmitting an electrical signal in a first conductive via structure and a second conductive via structure of a semiconductor structure, the first conductive via structure including a first capacitive structure and a second capacitive structure, wherein the semiconductor structure further comprises a third capacitive structure separate from the first conductive via structure and the second conductive via structure; and during the transmitting of the electrical signal in the first conductive via structure and the second conductive via structure, storing energy in an electric field through a first mutual capacitance between the first capacitive structure and the third capacitive structure and a second mutual capacitance between the second capacitive structure and the third capacitive structure, wherein the semiconductor structure comprises a plurality of insulating layers stacked alternately with each other along a vertical direction, wherein the plurality of insulating layers comprise a top insulating layer and a bottom insulating layer, wherein each of the first conductive via structure and the second conductive via structure extends through the top insulating layer and the bottom insulating layer, wherein the third capacitive structure is fully encapsulated by the insulating layers and is free from being electrically connected to any conductive element extending through the top insulating layer or the bottom insulating layer.

19. The method of claim 18, wherein the first capacitive structure and the second capacitive structure extend in a vertical direction, wherein the first capacitive structure and the second capacitive structure do not overlap in projection in the vertical direction, wherein the third capacitive structure includes a first portion overlapped in projection with and the first capacitive structure in the vertical direction, and wherein the third capacitive structure includes a second portion overlapped in projection with the second capacitive structure in the vertical direction.

20. The method of claim 18, wherein the first capacitive structure of the first conductive via structure or the second capacitive structure of the second conductive via structure comprises a conductive pad in a top conductive layer or a bottom conductive layer of a plurality of conductive layers of the semiconductor structure.

* * * * *